(12) United States Patent
Phan et al.

(10) Patent No.: US 6,282,140 B1
(45) Date of Patent: Aug. 28, 2001

(54) MULTIPLEXOR HAVING A SINGLE EVENT UPSET (SEU) IMMUNE DATA KEEPER CIRCUIT

(75) Inventors: Ho Gia Phan, Saratoga, CA (US); Bin Li, Fairfax, VA (US)

(73) Assignees: Systems Integration Inc.; BAE Systems Information and Electronic, both of Rockville, MD (US)

( * ) Notice: Subject to any disclaimer, the term of this patent is extended or adjusted under 35 U.S.C. 154(b) by 0 days.

(21) Appl. No.: 09/589,732

(22) Filed: Jun. 8, 2000

(51) Int. Cl.$^7$ ................................................... G11C 8/00
(52) U.S. Cl. ............... 365/230.02; 365/203; 365/189.02
(58) Field of Search ............................... 365/230.02, 203, 365/189.02, 205, 208, 207

(56) References Cited

U.S. PATENT DOCUMENTS 5,828,610 * 10/1998 Rogers et al. ...................... 365/203
5,905,684 * 5/1999 Hill ....................................... 365/203

* cited by examiner

*Primary Examiner*—David Nelms
*Assistant Examiner*—David Lam
(74) *Attorney, Agent, or Firm*—Antony P. Ng; Bracewell & Patterson, L.L.P.

(57) ABSTRACT

A multiplexor having a single event upset (SEU) hardened data keeper circuit is disclosed. The multiplexor includes a precharge transistor, an isolation transistor, an invertor, and an SEU immune storage cell. Both the gate of the precharge transistor and the gate of the isolation transistor are connected to a clock signal. The SEU immune storage cell has a first access node and a second access node. The first access node is complementary to the second access node. The first access node is connected to the precharge transistor and the second access node is connected to the isolation transistor. The invertor is coupled between the precharge transistor and the isolation transistor.

14 Claims, 7 Drawing Sheets

MULTIPLEXOR HAVING A SINGLE EVENT UPSET (SEU) IMMUNE DATA KEEPER CIRCUIT

BACKGROUND OF THE INVENTION

1. Technical Field

The present invention relates to integrated circuits in general, and in particular to multiplexors. Still more particularly, the present invention relates to a multiplexor having a single event upset immune data keeper circuit.

2. Description of the Prior Art

High-speed static random access memories (SRAMs) typically require a group of special sensing circuits, commonly known as sense amplifiers, to sense and amplify any small signal delivered by a storage cell that is selected for a read operation. While using six-transistor cells as storage cells for data storage, a single-port or multi-port SRAM also use a bitline pair to connect the storage cells to a respective column of sense amplifiers to provide differential sensing. The sense amplifiers are then coupled to a group of multiplexors that employs data keeper circuits for data output from any one of the columns.

Referring now to the drawings and in particular to FIG. 1, there is illustrated a schematic diagram of a multiplexor having a data keeper circuit according to the prior art. As shown, a multiplexor 10 includes a data keeper circuit 14, a p-channel precharge transistor 15, and a series of n-channel input transistors 16a–16n. Data keeper circuit 14 includes a p-channel keeper transistor 11 and an inverter 12. The drain of keeper transistor 11 is connected to the input of inverter 12, and the gate of keeper transistor 11 is connected to the output of inverter 12. Data keeper circuit 14 is also coupled to p-channel precharge transistor 15 and n-channel input transistors 16a–16n. Inputs $IN_0$ through $IN_n$ are connected to a gate of a corresponding one of input transistors 16a–16n.

During a precharge cycle (i.e., when the clock signal to the gate of transistor 15 is low), a precharge node x is precharged to a logical high state. During an evaluation cycle (i.e., when the clock signal to the gate of transistor 15 is high), inputs $IN_0$–$IN_n$ are evaluated and the result appears at the output of multiplexor 10. When the clock signal to the gate of transistor 15 is low again for the next precharge cycle, a logical high state is maintained within data keeper circuit 14.

In order to improve the speed of multiplexor 10, the precharge cycle is often shortened such that the precharge cycle can be completed before the evaluation cycle begins. During this transition period, transistor 15 and input transistors 16a–16n are all turned off, and thus, precharge node x is "floating." As a result, precharge node x becomes very susceptible to single event upsets (SEUs) that may affect the data stored within data keeper circuit 14. The present disclosure provides an improved multiplexor to handle this problem.

SUMMARY OF THE INVENTION

In accordance with a preferred embodiment of the present invention, a multiplexor having a single event upset (SEU) immune data keeper circuit includes a precharge transistor, an isolation transistor, an invertor, and an SEU immune storage cell. Both the gate of the precharge transistor and the gate of the isolation transistor are connected to a clock signal. The SEU immune storage cell has a first access node and a second access node. The first access node is complementary to the second access node. The first access node is connected to the precharge transistor and the second access node is connected to the isolation transistor. The invertor is coupled between the precharge transistor and the isolation transistor.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
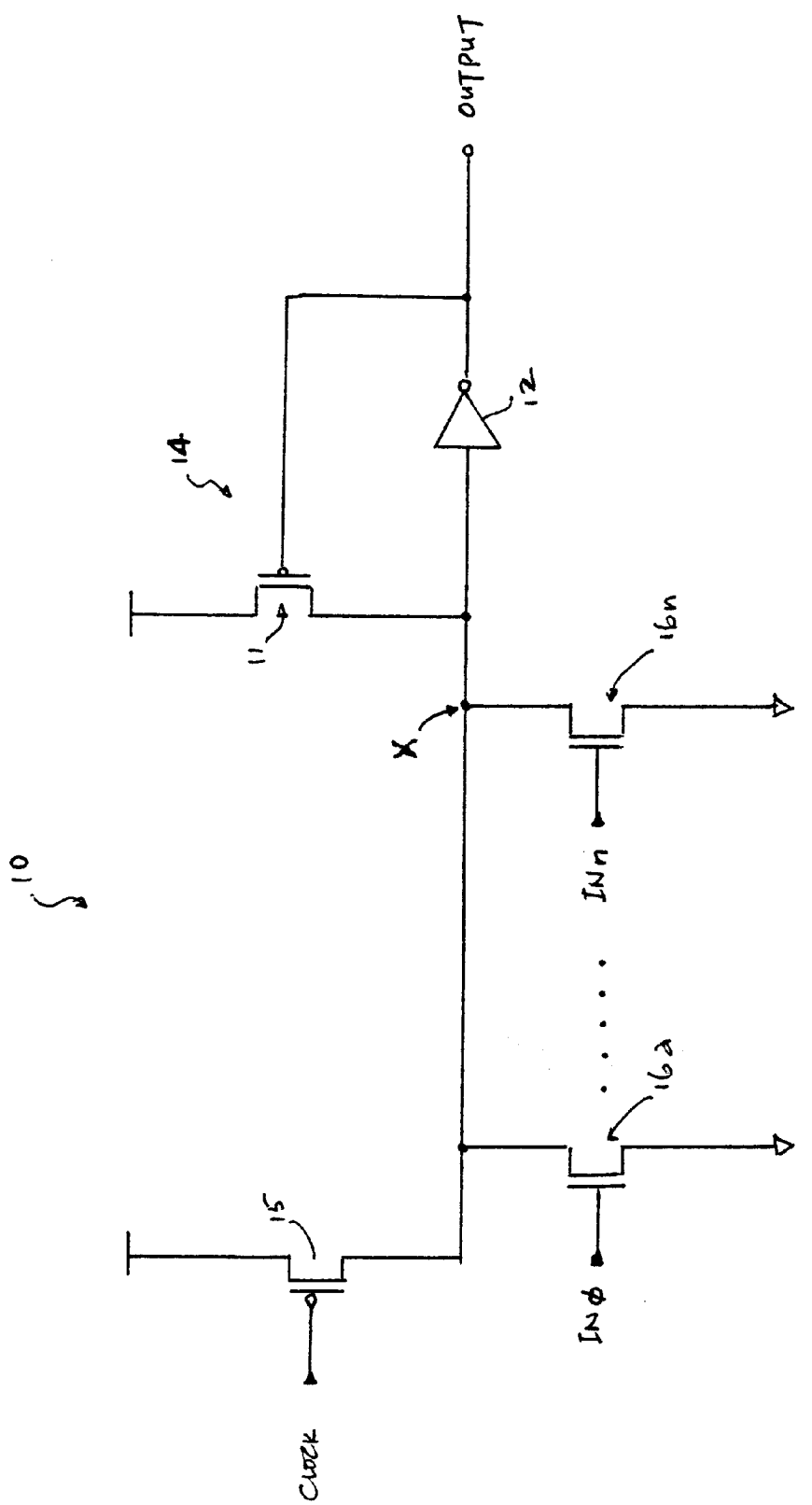
FIG. 1 is a schematic diagram of a multiplexor having a data keeper circuit according to the prior art.
Figure 2:
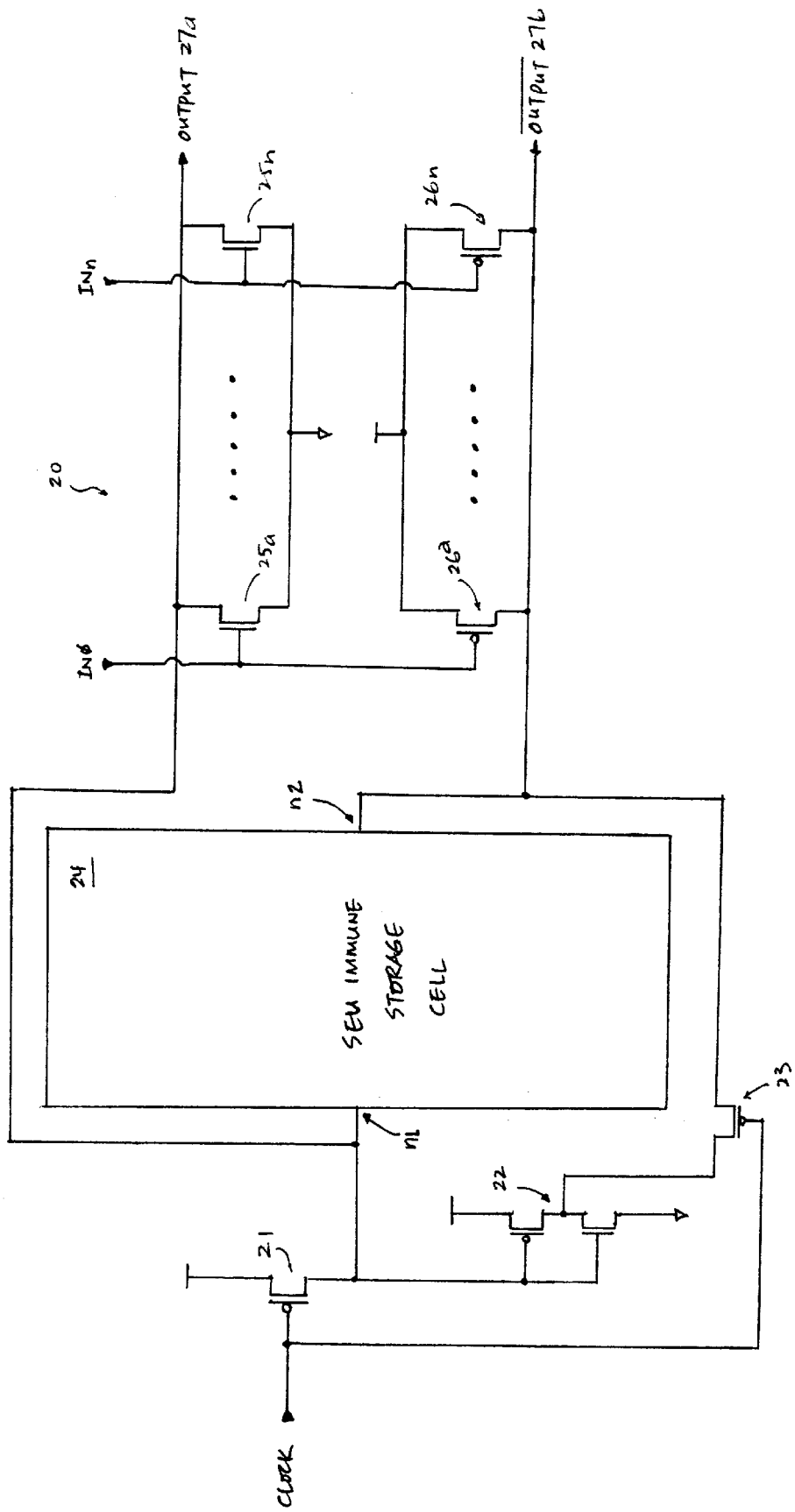
FIG. 2 is a schematic diagram of a multiplexor having a single event upset (SEU) immune data keeper circuit, in accordance with a preferred embodiment of the present invention.

With reference now to FIG. 2, there is depicted a schematic circuit diagram of a multiplexor having a single event upset (SEU) immune data keeper circuit, in accordance with a preferred embodiment of the present invention. As shown, a multiplexor 20 includes a p-channel precharge transistor 21, an inverter 22, a p-channel isolation transistor 23, and an SEU immune storage cell (or memory cell) 24. SEU immune storage cell 24 can be implemented with any type of data storage cell that is SEU immune. SEU immune storage cell 24 can be accessed via any one of the two complementary access nodes n1 and n2. Inverter 22 is preferably made up of a p-channel transistor and an n-channel transistor connected in series. Multiplexor 20 also includes a series of n-channel input transistors 25a–25n along with their complementary p-channel input transistors 26a–26n. Inputs $IN_0$ through $IN_n$ are connected to a gate of a corresponding one of input transistors 25a–25n and input transistors 26a–26n.

During a precharge cycle when a clock signal is low, both precharge transistor 21 and isolation transistor 23 are turned on, and access node n1 is precharged to a logical high state (while access node n2 is set to a logical low state). During an evaluation cycle when the clock signal is low, both precharge transistor 21 and isolation transistor 23 are turned off, inputs $IN_0$–$IN_n$ are evaluated and the result appears at an output 27a and a complementary output 27b. When the clock signal to the gate of transistor 21 is low again for the next precharge cycle, the result from the previous evaluation cycle is maintained within SEU immune storage cell 24.

Figure 3:
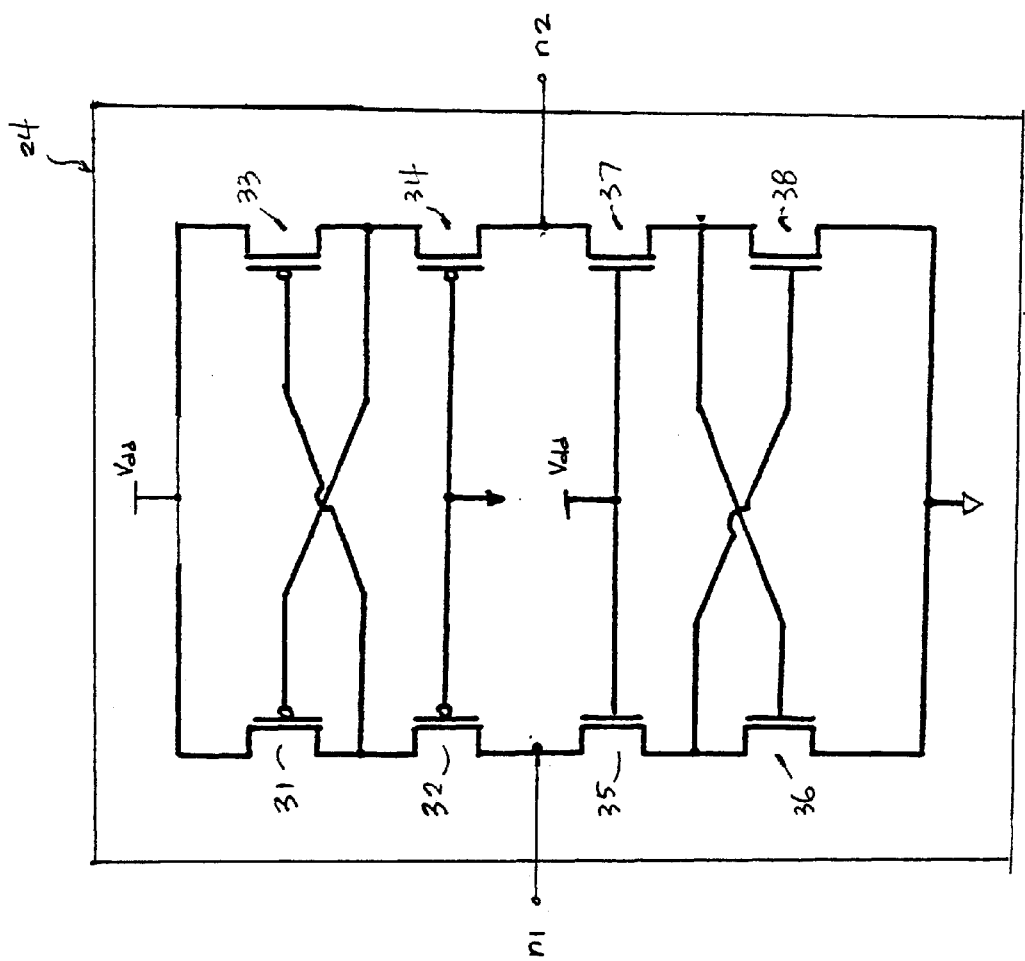
FIG. 3 is a schematic circuit diagram of an SEU immune storage cell within the SEU immune data keeper circuit from FIG. 2.

Referring now to FIG. 3, there is illustrated a schematic circuit diagram of SEU immune storage cell 24. As shown, SEU immune storage cell 24 includes p-channel transistors 31–34 and n-channel transistors 35–38. Transistors 31, 32, 35, and 36 are connected in series, with the source of transistor 31 connected to a power supply, $V_{dd}$, and transistor 36 connected to ground. Similarly, transistors 33, 34, 37, and 38 are connected in series, with the source of transistor 33 connected to $V_{dd}$ and transistor 38 connected to ground.

In addition, transistors 31, 32 are cross-coupled to transistors 33, 34, and transistors 35, 36 are cross-coupled to transistors 37, 38. For transistors 31–34, the cross-coupling is accomplished by connecting the gate of transistor 31 to a node between transistors 33 and 34, and by connecting the gate of transistor 33 to a node between transistors 31 and 32. For transistors 35–38, the cross-coupling is accomplished by connecting the gate of transistor 36 to a node between transistors 37 and 38, and by connecting the gate of transistor 38 to a node between transistors 35 and 36.

Furthermore, the gates of transistors 32 and 34 are connected to a low voltage, such as ground; while the gates of transistors 35 and 37 are connected to a high voltage, such as a power supply $V_{dd}$. Thus, transistors 32 and 35 function as isolation transistors for transistors 31 and 36, respectively. Similarly, transistors 34 and 37 function as isolation transistors for transistors 33 and 38, respectively. As a result, two inversion paths are formed. The first inversion path includes transistors 31, 34, 37, and 36; and the second inversion path includes transistors 33, 32, 35, and 38.

During operation, the voltages of nodes n1 and n2 are always logical complements to each another. The sizes of transistors 31–38 are generally chosen such that when nodes n1 and n2 are turned on, a differentially low voltage at node n1 and node n2 can force node n2 to a logic high state, and node n1 to a logic low state or node n2 to a logic low state and node n1 to a logic high state.

The width-to-length ratios of transistors 32, 34 and 35, 37 are chosen to assist in the protection against high energy particle upset. Transistors 32, 34 are much smaller in comparison to the cross-coupled transistors 31, 33. Thus, a significant amount of voltage can be dropped across each of transistors 32 and 34 with respect to cross-coupled transistors 31 and 33. In essence, transistors 32, 34 provides SEU immunity for cross-coupled transistors 31, 33 via voltage division between nodes n1, n2 and $V_{dd}$. Similarly, transistors 35, 37 are much smaller in comparison to the cross-coupled transistors 36, 38. Thus, a significant amount of voltage can be dropped across each of transistors 35 and 37 with respect to cross-coupled transistors 36 and 38. Transistors 35, 37 provides SEU immunity for cross-coupled transistors 36, 38 via voltage division between nodes n1, n2 and ground. As a result, the sensitive storage nodes of storage cell 24 are protected from SEUs. The exact relative ratio between transistors 32, 34, 35, 37 and the remaining transistors depends on the supply voltage $V_{dd}$ and the threshold voltage of the transistors.

Figure 4:
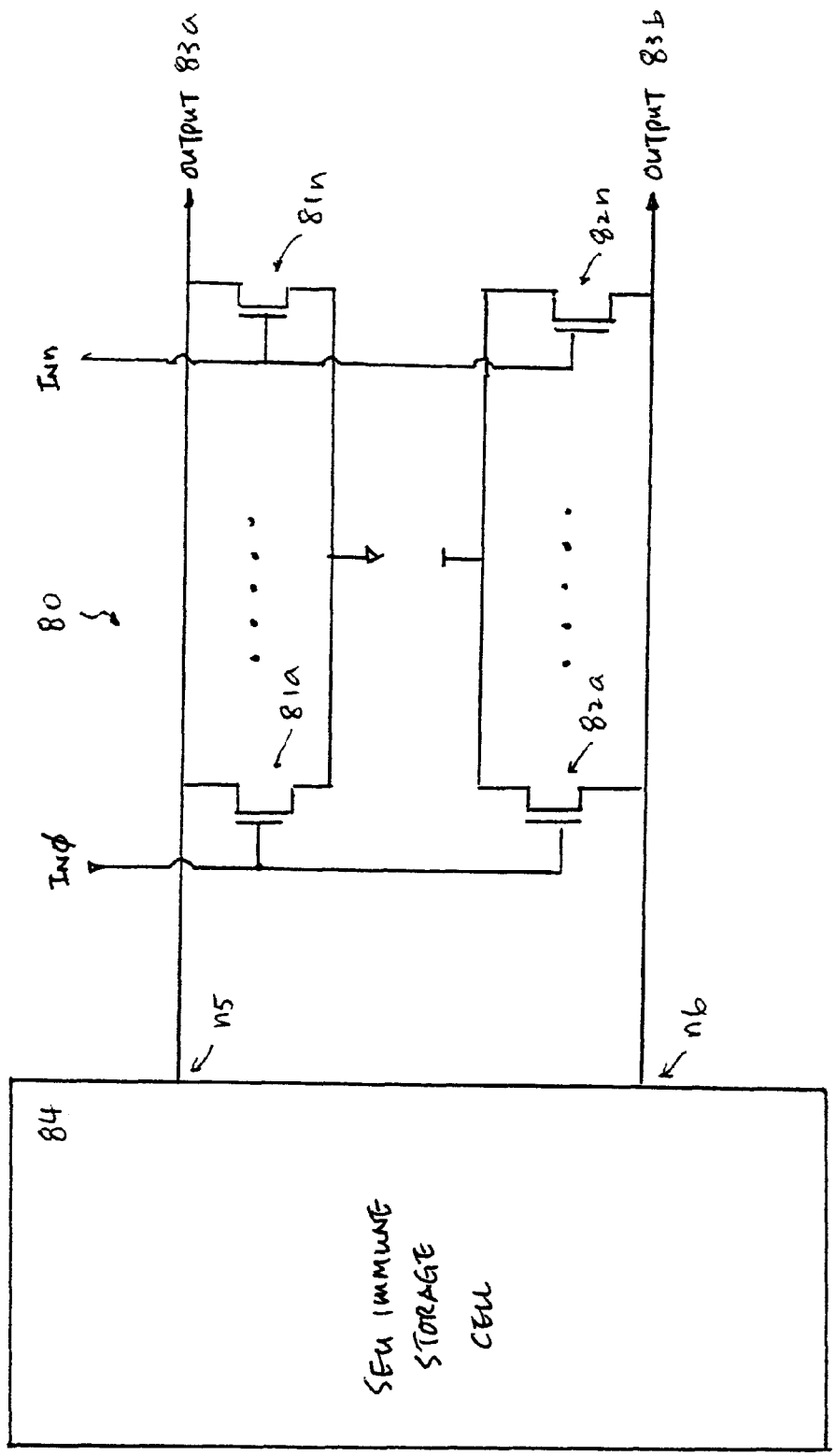
FIG. 4 is a schematic diagram of a multiplexor having an SEU immune data keeper circuit, in accordance with a second embodiment of the present invention.

With reference now to FIG. 4, there is illustrated a schematic circuit diagram of a multiplexor having an SEU immune data keeper circuit, in accordance with a second embodiment of the present invention. As shown, a multiplexor 80 includes an SEU immune storage cell (or memory cell) 84 and a first series of n-channel input transistors 81a–81n along with a series of n-channel input transistors 82a–82n. Inputs $IN_0$ through $IN_n$ are connected to a gate of a corresponding one of input transistors 81a–81n and input transistors 82a–82n. SEU immune storage cell 84 can be implemented with any type of data storage cell that is SEU immune. SEU immune storage cell 84 can be accessed via any one of the two non-complementary access nodes n5 and n6. Multiplexor 80 also has two non-complementary outputs 83a and 83b.

Figure 5:
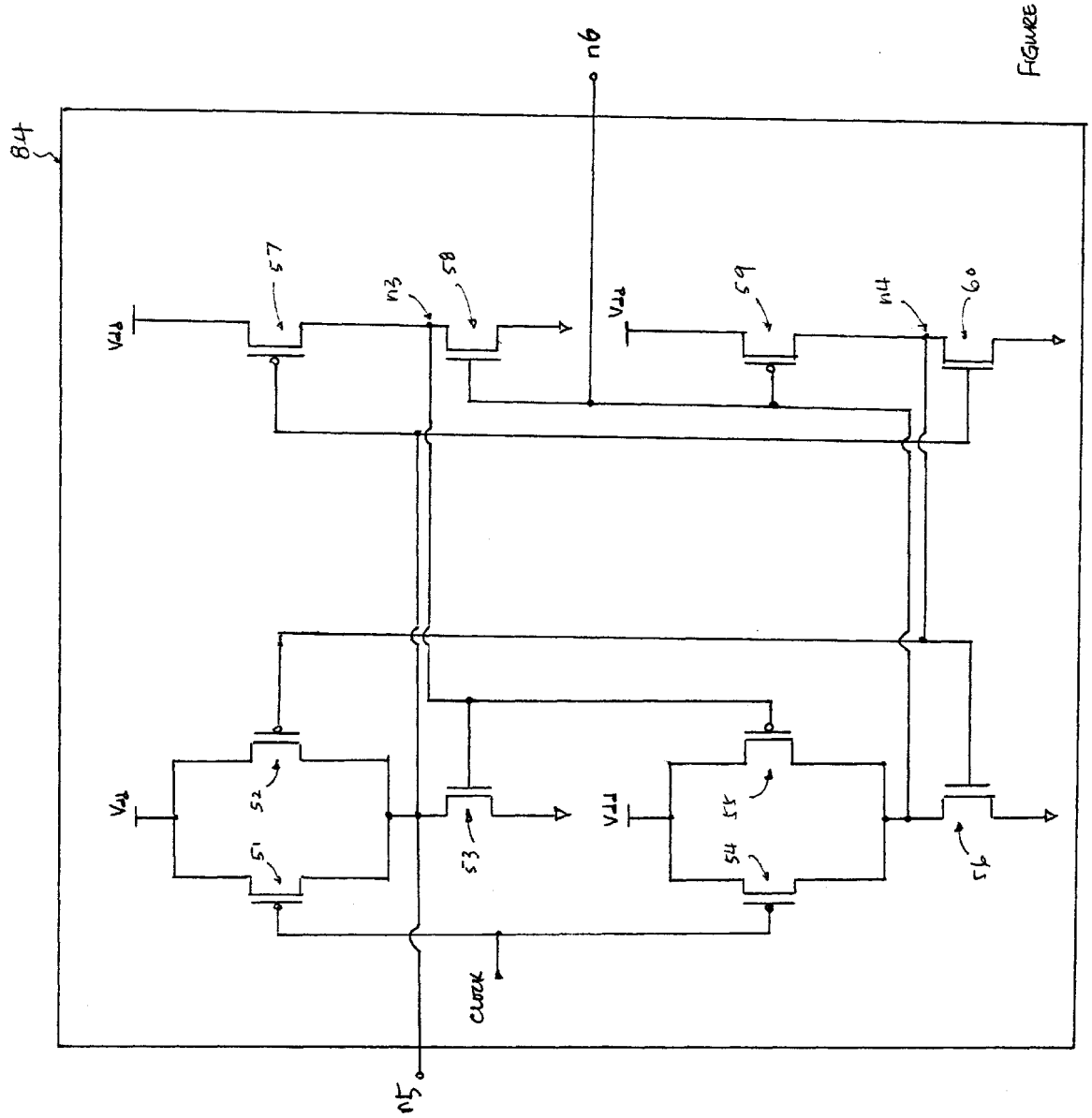
FIG. 5 is a schematic circuit diagram of an SEU immune storage cell within the SEU immune data keeper circuit from FIG. 4.

Referring now to FIG. 5, there is illustrated a schematic circuit diagram of SEU immune storage cell 84. As shown, SEU immune storage cell 84 includes transistors 51–60. Specifically, p-channel transistors 51, 52 are connected in series with n-channel transistor 53. Similarly, p-channel transistors 54, 55 are connected in series with n-channel transistor 56. In addition, p-channel transistor 57 is connected in series with n-channel transistor 58, and p-channel transistor 59 is connected in series with n-channel transistor 60.

The gate of transistor 52 is connected to the gate of transistor 56 as well as the node between transistors 59 and 60. The gate of transistor 57 is connected to the gate of transistor 60 as well as the node between transistors 52 and 53. As such, transistors 52, 55, and 56 are cross-coupled to transistors 57–60. A clock signal is input to the gates of transistors 51 and 54. Node n1 is the node between transistors 52 and 53. Node n2 is the node between transistors 55 and 56.

Transistors 51 and 54 are used to reset nodes n5 and n6 to $V_{dd}$ and to cause node n3 and node n4 to ground. The rest of the transistors in FIG. 5 (i.e., transistors 52–53 and 55–60) are represented as cross-coupling in a latch with a redundant circuit. The operation for resetting node n5 and node n6 to $V_{dd}$ is as follows. When the clock signal is low, transistors 51 and 54 are on and charging node n5 and node n6 to $V_{dd}$. When node n5 reaches $V_{dd}$, transistor 60 will be turned on and transistor 59 will be turned off. Then, node n4 is discharged to ground. Similarly, when node n2 reaches $V_{dd}$, transistor 58 will be turned on and transistor 57 will be turned off. Then, node n4 is discharged to ground. In order to charge node n3 and node n4 to $V_{dd}$, node n5 and node n6 have to be at ground.

Node n3 and node n4 can be set as follows. When node n5 and node n2 are at ground, transistors 57 and 59 will be turned on and transistors 58, 60 will be turned off, respectively. As a result, node n3 and node n4 will be charged to $V_{dd}$. Thus, node n3 and node n4 are complementary nodes for node n5 and node n6, respectively.

Figure 6:
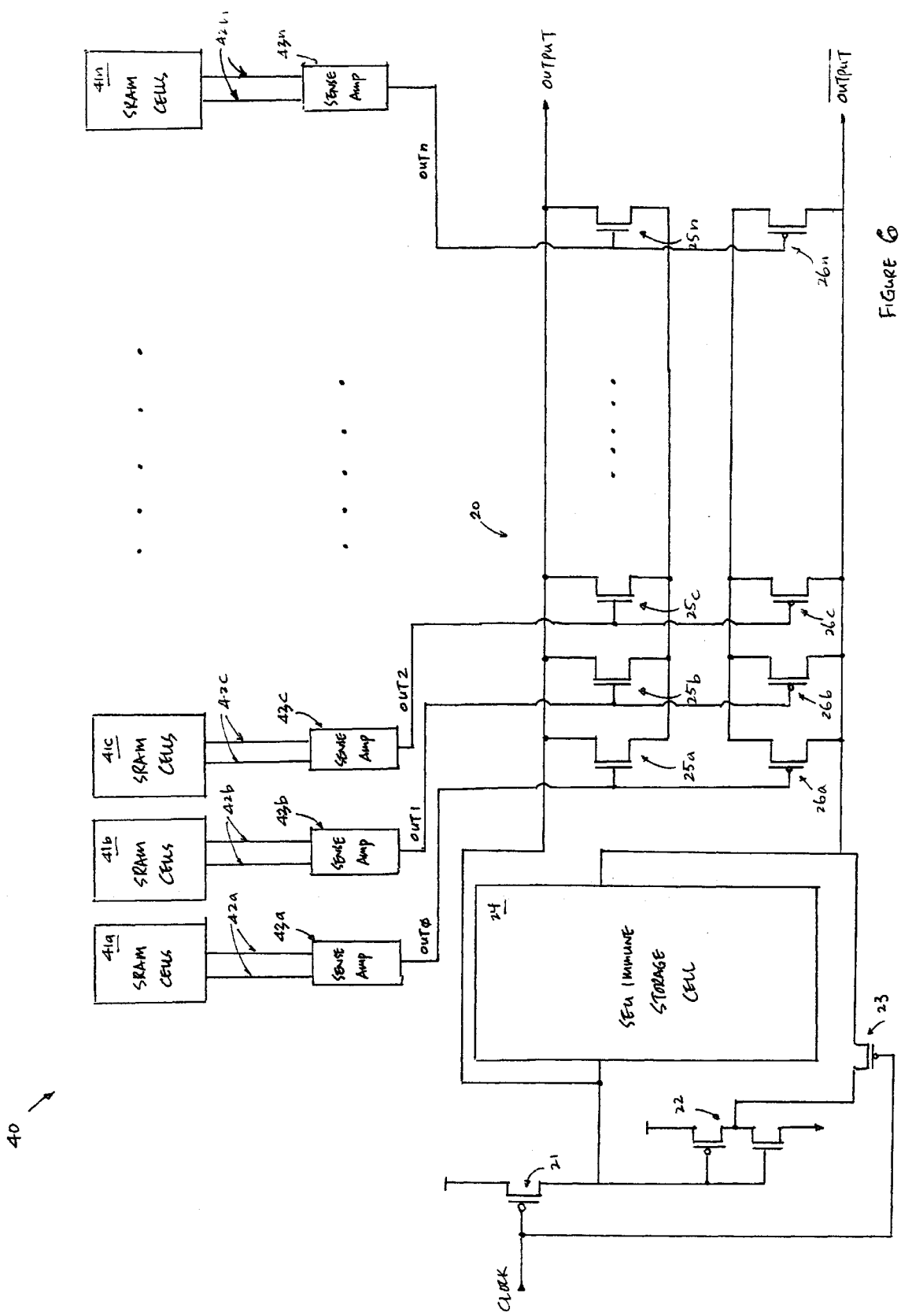
FIG. 6 is a block diagram depicting an implementation of the multiplexor from FIG. 2.

With reference now to FIG. 6, there is illustrated a block diagram depicting an implementation of multiplexor 20 from FIG. 2, in accordance with a preferred embodiment of the present invention. As shown, a memory device 40 includes SRAM cells 41a–41n arranged in different columns. Each of SRAM cells 41a–41n is coupled to a corresponding sense amplifier 43a–43n via a respective one of bitline pairs 42a–42n. Bitline pairs 42a–42n allow differential sensing for any data stored within SRAM cells 41a–41n, as it is well-known to those skilled in the relevant art. Each of sense amplifiers 43a–43n provides an output, such as $OUT_0$ from sense amplifier 43a to $OUT_n$ from sense amplifier 43n. Each of outputs $OUT_0$–$OUT_n$ is connected to a corresponding gate of transistors 25a–25n of multiplexor 20. In this implementation, transistors 25a–25n of multiplexor 20 provide a wire-or function for SRAM cells 41a–41n. During normal operation, only one of SRAM cells 41a–41n may be activated such that data stored within the activated cell can be directed to the output of multiplexor 20. This SEU immune data keeper circuit will maintain the right data on the output node. It is understood by those skilled in the art that multiplexor 20 can be substituted by multiplexor 80 from FIG. 4.

As has been described, the present invention provides an improved multiplexor having an SEU immune data keeper circuit to be utilized within an integrated circuit device. The integrated circuit device may be a memory device, a processor, a controller, etc. All the transistors depicted in the present invention are preferably field effect transistors (FETs) fabricated with the bulk complementary-metal-oxide semiconductor (CMOS) or any other applicable processing technology that is known to those skilled in the relevant art. Although exemplary SEU immune storage cells shown in FIGS. 3 and 5 are utilized to illustrated the preferred embodiment of the present invention, it is understood the SEU immune storage cell shown in FIGS. 3 and 5 can be substituted by any other SEU immune storage cell that is well-known in the art.

Figure 7:
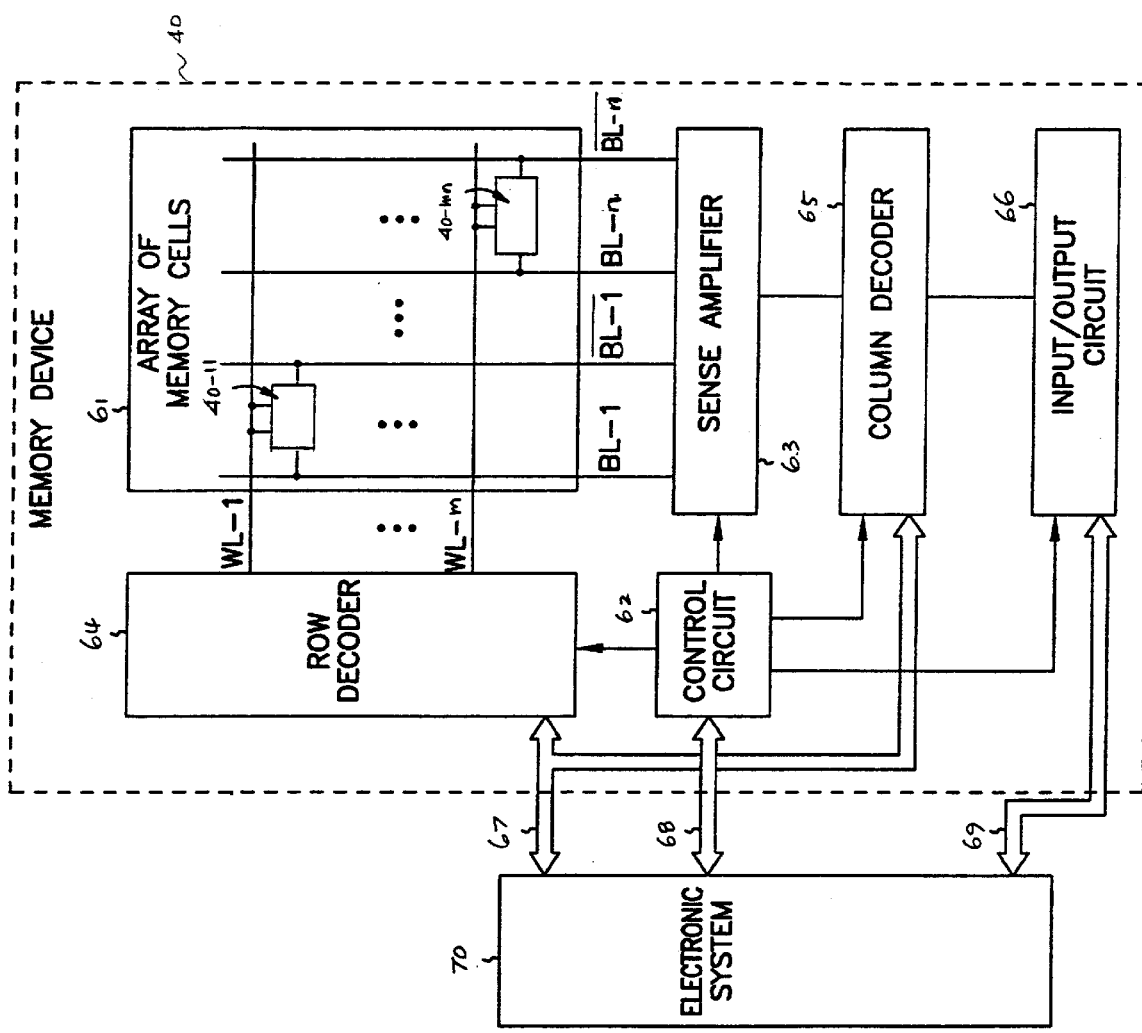
FIG. 7 is a block diagram of an apparatus in which the present invention may be incorporated.

The present invention may be implemented in a variety of apparatuses having an SRAM. For example, with reference now to FIG. 7, there is depicted a block diagram of an apparatus in which a preferred embodiment of the present invention may be incorporated. As shown, the apparatus includes an electronic system 70 coupled to memory device 40. Electronic system 70 may be, for example, a processor, a memory controller, a chip set or any system that stores data in a memory device such as memory device 40. Electronic system 70 is coupled to a row decoder 64 and a column decoder 65 of memory device 40 via address lines 67. Electronic system 70 is also coupled to a control circuit 62 of memory device 40 via control lines 68. In addition, electronic system 70 is coupled to an input/output circuit 66 of memory device 40 via input/output lines 69.

Memory device 40 includes a sense amplifier 63 and a memory cell array 61. Array 61 includes a number of wordlines, WL-1 through WL-m, and a number of bit line pairs, BL-1 through BL-n (and $\overline{BL}$-1 through $\overline{BL}$-n). Array 61 is constructed to use a memory cell sensing scheme such that each bit line pair is to be used in reading and writing data into a SRAM cell such as SRAM cell 40-11. Memory device 40 is controlled by control circuit 62. Control circuit 62 is coupled to row decoder 64, column decoder 65, input/output circuit 66, and sense amplifier 63.

Memory device 40 reads and writes data for electronic system 70. For example, in order to read a value from SRAM cell 40-11 in a read operation, electronic system 70 provides the address of SRAM cell 40-11 to row decoder 64 over address lines 67. Electronic system 70 also provides control signals to control circuit 62 over control lines 68. Control circuit 62 provides signals to sense amplifier 63 that causes an equilibrate circuit (not shown) within sense amplifier 63 to equilibrate the voltages on bit lines BL-1 and $\overline{BL}$-1. The equilibrate circuit of sense amplifier 63 forces bit lines BL-1 and $\overline{BL}$-1 to a common voltage; for example, $V_{dd}-V_t$. It is noted that the voltage range between the high and low logic levels for sense amplifier 63 differs from that of SRAM cell 40-11.

With the charge on bit line pair, sense amplifier 63 next detects the logic state of SRAM cell 40-11. Column decoder 65 receives the column address of the selected cell from electronic system 70. Column decoder 65 identifies the appropriate bit line pair for sense amplifier 63 to use in reading the value from SRAM cell 40-11. Sense amplifier 63 senses and amplifies the differential voltage across the bit line pair and thus produces high and low logic levels on complementary nodes of sense amplifier 63 that correspond to the states of the sensed bit line pair. These voltage levels are passed to electronic system 70 by input/output circuit 66 via input/output lines 69.

In a write operation, electronic system 70 provides data to be written to, for example, SRAM cell 40-11 over input/output lines 69 to input/output circuit 67. Column decoder 65 receives the column address from electronic system 70 via address lines 67 to select the appropriate bit line pair for the selected SRAM cell. Sense amplifier 63, under the control of control circuit 62, forces the bit line pair for SRAM cell 40-11 to complementary high and low logic levels based on the data to be stored in SRAM cell 40-11. Row decoder 64 receives an address from electronic system 70 over address line 67 that indicates the appropriate wordline to activate for this store operation. In this process, the high and low logic levels for sense amplifier 63 are translated to appropriate voltage levels for SRAM cell 40-11.

While the invention has been particularly shown and described with reference to a preferred embodiment, it will be understood by those skilled in the art that various changes in form and detail may be made therein without departing from the spirit and scope of the invention.

What is claimed is:

1. A multiplexor, comprising:
    a precharge transistor having a gate connected to a clock signal;
    an isolation transistor having a gate connected to said clock signal; and
    a single event upset immune storage cell having a first access node and a second access node, wherein said first access node is complementary to said second access node, wherein said first access node is connected to said precharge transistor and said second access node is connected to said isolation transistor; and
    a plurality of n-channel transistors connected to said first access node of said single event upset immune storage cell, wherein plurality of n-channel transistors are connected in parallel to each other.

2. The multiplexor according to claim 1, wherein said multiplexor further includes an invertor coupled between said precharge transistor and said isolation transistor.

3. The multiplexor according to claim 2, wherein said invertor includes a p-channel transistor and an n-channel transistor.

4. The multiplexor according to claim 1, wherein said precharge transistor and said isolation transistor are p-channel transistors.

5. A memory device, comprising:
    a plurality of memory cells;
    a plurality of sense amplifiers coupled to said plurality of memory cells; and
    a multiplexor coupled to said plurality of sense amplifiers, wherein said multiplexor includes
        a precharge transistor having a gate connected to a clock signal;
        an isolation transistor having a gate connected to said clock signal; and
        a single event upset (SEU) immune storage cell having a first access node and a second access node, wherein said first access node is complementary to said second access node, wherein said first access node is connected to said precharge transistor and said second access node is connected to said isolation transistor.

6. The memory device according to claim 5, wherein said multiplexor further includes an invertor coupled between said precharge transistor and said isolation transistor.

7. The memory device according to claim 6, wherein said invertor includes a p-channel transistor and an n-channel transistor.

8. The memory device according to claim 5, wherein said precharge transistor and said isolation transistor are p-channel transistors.

9. The memory device according to claim 5, wherein said multiplexor further includes a plurality of n-channel transistors connected to said first access node of said SEU immune storage cell, wherein plurality of n-channel transistors are connected in parallel to each other.

10. An apparatus, comprising:
   an electronic system; and
   a memory device coupled to said electronic system, wherein said memory device includes a plurality of memory cells, a plurality of sense amplifiers coupled to said plurality of memory cells, and a multiplexor coupled to said plurality of sense amplifiers, wherein said multiplexor includes:
   a precharge transistor having a gate connected to a clock signal;
   an isolation transistor having a gate connected to said clock signal; and
   an SEU immune storage cell having a first access node and a second access node, wherein said first access node is complementary to said second access node, wherein said first access node is connected to said precharge transistor and said second access node is connected to said isolation transistor.

11. The apparatus according to claim 10, wherein said multiplexor further includes an invertor coupled between said precharge transistor and said isolation transistor.

12. The apparatus according to claim 11, wherein said invertor includes a p-channel transistor and an n-channel transistor.

13. The apparatus according to claim 10, wherein said precharge transistor and said isolation transistor are p-channel transistors.

14. The apparatus according to claim 10, wherein said multiplexor further includes a plurality of n-channel transistors connected to said first access node of said SEU immune storage cell, wherein plurality of n-channel transistors are connected in parallel to each other.

* * * * *